US012720740B2

(12) United States Patent
Song et al.

(10) Patent No.: US 12,720,740 B2
(45) Date of Patent: Aug. 25, 2026

(54) THREE-DIMENSIONAL FLASH MEMORY SUPPORTING HOLE INJECTION ERASE TECHNIQUE AND METHOD FOR MANUFACTURING SAME

(71) Applicant: IUCF-HYU (INDUSTRY-UNIVERSITY COOPERATION FOUNDATION HANYANG UNIVERSITY), Seoul (KR)

(72) Inventors: Yun Heub Song, Seoul (KR); Sun Jun Choi, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 820 days.

(21) Appl. No.: 17/789,282

(22) PCT Filed: Dec. 24, 2020

(86) PCT No.: PCT/KR2020/019135
§ 371 (c)(1),
(2) Date: Jun. 27, 2022

(87) PCT Pub. No.: WO2021/133117
PCT Pub. Date: Jul. 1, 2021

(65) Prior Publication Data

US 2023/0067598 A1 Mar. 2, 2023

(30) Foreign Application Priority Data

Dec. 26, 2019 (KR) ........................ 10-2019-0174712

(51) Int. Cl.
*H10B 43/27* (2023.01)
*G11C 16/14* (2006.01)
*H10B 43/10* (2023.01)

(52) U.S. Cl.
CPC ............. *H10B 43/27* (2023.02); *G11C 16/14* (2013.01); *H10B 43/10* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 6,436,845 B1 * 8/2002 Kamath .......... H01L 21/823462
257/E21.625
2005/0204212 A1 * 9/2005 Noguchi ................ G11C 29/76
714/710

(Continued)

FOREIGN PATENT DOCUMENTS

KR 10-2012-0031110 A 3/2012
KR 10-2013-0051074 A 5/2013
KR 10-2018-0063357 A 6/2018

OTHER PUBLICATIONS

International Search Report of PCT/KR2020/019135 dated Apr. 5, 2021 [PCT/ISA/210].

*Primary Examiner* — William B Partridge
*Assistant Examiner* — Gustavo G Ramallo
(74) *Attorney, Agent, or Firm* — Sughrue Mion, PLLC

(57) ABSTRACT

Disclosed are a three-dimensional flash memory, which reduces leakage current and supports a hole injection erase technique, and a method for manufacturing same. According to an embodiment, the three-dimensional flash memory comprises: a substrate; a channel layer extending in one direction on the substrate and having the shape of a hollow
(Continued)

macaroni; and a P-type filer extending in the one direction while filling the inner space of the channel layer.

1 Claim, 15 Drawing Sheets

(58) Field of Classification Search
CPC ........ H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

2007/0045716 A1* 3/2007 Chen ...................... H10D 30/69
257/326
2007/0249120 A1* 10/2007 Ishida .................... H10B 69/00
257/296
2009/0121271 A1* 5/2009 Son ........................ H10B 41/27
257/315
2010/0270593 A1* 10/2010 Lung ...................... H10B 43/27
257/E21.532
2013/0292758 A1 11/2013 Oota et al.
2015/0200259 A1* 7/2015 Lim ..................... H10D 30/693
257/326
2016/0372481 A1* 12/2016 Izumida ................. H10B 43/27
2018/0040742 A1* 2/2018 Matsuo .................. H10B 43/27
2019/0043830 A1 2/2019 Sakakibara et al.
2025/0017017 A1* 1/2025 Heo ....................... H10B 43/27

* cited by examiner

THREE-DIMENSIONAL FLASH MEMORY SUPPORTING HOLE INJECTION ERASE TECHNIQUE AND METHOD FOR MANUFACTURING SAME

CROSS REFERENCE TO RELATED APPLICATIONS

This application is a National Stage of International Application No. PCT/KR2020/019135, filed Dec. 24, 2020, claiming priority to Korean Patent Application No. 10-2019-0174712, filed Dec. 26, 2019.

TECHNICAL FIELD

Embodiments of the inventive concept described herein relate to a three-dimensional (3D) flash memory, and more particularly, relate to a 3D flash memory supporting a hole injection erase technique, and a manufacturing method thereof.

BACKGROUND ART

A flash memory device that is an electrically erasable programmable read only memory (EEPROM) may be used in common, for example, in a computer, a digital camera, an MP3 player, a game system, a memory stick, etc. The flash memory device electrically programs/erases data by using Fowler-Nordheim (F-N) tunneling or hot electron injection.

In detail, referring to FIG. 1 showing an array of a conventional 3D flash memory, the array of the 3D flash memory may include a common source line CSL, a bit line BL, and a plurality of cell strings CSTR interposed between the common source line CSL and the bit line BL.

Bit lines are arranged two-dimensionally, and the plurality of cell strings CSTR are connected in parallel with each of the bit lines. The cell strings CSTR may be connected in common with the common source line CSL. That is, the plurality of cell strings CSTR may be disposed between a plurality of bit lines and one common source line CSL. In this case, the common source line CSL may include a plurality of common source lines, and the plurality of common source lines CSL may be two-dimensionally arranged. Here, the same voltage may be electrically applied to the plurality of common source lines CSL, or the plurality of common source lines CSL may be electrically controlled independently of each other.

Each of the cell strings CSTR may include a ground selection transistor GST connected with the common source line CSL, a string selection transistor SST connected with the bit line BL, and a plurality of memory cell transistors MCT interposed between the ground selection transistor GST and the string selection transistor SST. In each cell string CSTR, the ground selection transistor GST, the string selection transistor SST, and the memory cell transistors MCT may be connected in series.

The common source line CSL may be connected in common to sources of the ground selection transistors GST. In addition, the ground selection line GSL, a plurality of word lines WL0 to WL3, and the plurality of string selection lines SSL, which are positioned between the common source line CSL and the bit line BL, may be respectively used as gate layers of the ground selection transistors GST, the memory cell transistors MCT, and the string selection transistors SST. Also, each of the memory cell transistors MCT includes a memory element.

Meanwhile, a conventional 3D flash memory may increase the degree of integration by vertically stacking cells to satisfy requirements of a consumer such as an excellent performance and a low price.

For example, referring to FIG. 2 showing a structure of a conventional 3D flash memory, the conventional 3D flash memory is manufactured by arranging electrode structures 215 in which interlayer insulating layers 211 and horizontal structures 250 are formed alternately and repeatedly on a substrate 200. The interlayer insulating layers 211 and the horizontal structures 250 may be extended in a first direction. The interlayer insulating layers 211 may be, for example, a silicon oxide layer, and the lowest interlayer insulating layer 211*a* of the interlayer insulating layers 211 may be smaller in thickness than the remaining interlayer insulating layers 211. Each of the horizontal structures 250 may include a first blocking insulating layer 242, a second blocking insulating layer 243, and an electrode layer 245. The conventional three-dimensional flash memory may include a plurality of electrode structures 215, and the plurality of electrode structures 215 may be arranged to face each other in a second direction intersecting the first direction. The first direction and the second direction may correspond to an x-axis and a y-axis of FIG. 2, respectively. Trenches 240 may be extended in the first direction such that the plurality of electrode structures 215 are spaced from each other. Impurity regions doped with impurities of a high concentration may be formed in the substrate 200 exposed by the trenches 240 such that the common source line CSL is disposed. Although not illustrated, device isolation layers filling the trenches 240 may be further disposed.

Vertical structures 230 penetrating the electrode structures 215 may be disposed. For example, in a plan view, the vertical structures 230 may be aligned in the first and second directions so as to be disposed in a matrix form. For another example, the vertical structures 230 may be aligned in the second direction and may be arranged in the first direction in a zig-zag form. Each of the vertical structures 230 may include a protection layer 224, a charge storage layer 225, a tunnel insulating layer 226, and a channel layer 227. For example, the channel layer 227 may be formed in a form of a hallow tube. In this case, a buried layer filling the inside of the channel layer 227 may be further formed. A drain region "D" may be disposed over the channel layer 227, and a conductive pattern 229 may be formed on the drain region "D" so as to be connected with a bit line BL. The bit line BL may be extended in a direction intersecting the horizontal electrodes 250, for example, the second direction. For example, the vertical structures 230 aligned in the second direction may be connected with one bit line BL.

The first and second blocking insulating layers 242 and 243 included in the horizontal structure 250 and the charge storage layer 225 and the tunnel insulating layer 226 included in the vertical structure 230 may be defined as an oxide-nitride-oxide (ONO) layer being an information storage element. That is, a portion of the information storage element may be included in the vertical structure 230, and the others thereof may be included in the horizontal structure 250. For example, the charge storage layer 225 and the tunnel insulating layer 226 of the information storage element may be included in the horizontal structure 230, and the first and second blocking insulating layers 242 and 243 may be included in the horizontal structure 250, but are not limited thereto.

Epitaxial patterns 222 may be disposed between the substrate 200 and the vertical structures 230. The epitaxial patterns 222 connect the substrate 200 and the vertical structures 230. The epitaxial patterns 222 may be in contact with the horizontal structures 250 in at least one layer. That is, the epitaxial patterns 222 may be disposed to be in contact with the lowest horizontal structure 250*a*. According to another embodiment, the epitaxial patterns 222 may be disposed to be in contact with the horizontal structures 250 in a plurality of layers, for example, two layers. Meanwhile, when the epitaxial patterns 222 are disposed to be in contact with the lowest horizontal structure 250*a*, the lowest horizontal structure 250*a* may be smaller in thickness than the remaining horizontal structures 250. The lowest horizontal structure 250*a* being in contact with the epitaxial patterns 222 may correspond to the ground selection line GSL of the array in the 3D flash memory described with reference to FIG. 1, and the remaining horizontal structures 250 being in contact with the vertical structures 230 may correspond to the plurality of word lines WL0 to WL3, respectively.

Each of the epitaxial patterns 222 includes a recessed side wall 222*a*. As such, the lowest horizontal structure 250*a* being in contact with the epitaxial patterns 222 is disposed along a profile of the recessed side wall 222*a*. That is, the lowest horizontal structure 250*a* may be disposed to be convex inwardly along the recessed side wall 222*a* of the epitaxial pattern 222.

In the conventional 3D flash memory with this structure, as the number of stages thus vertically stacked increases, the length of the channel layer 227 is increased. This causes an increase in a leakage current of the channel layer 227 and deterioration of cell characteristics.

Accordingly, to reduce the leakage current, research and development on materials forming a channel layer have been conducted. As a result, an IGZO material with a low leakage current due to a wide band gap has been proposed as a channel layer material replacing polysilicon.

However, because the IGZO material has hole characteristics such as high hole effective mass and low hole mobility, the 3D flash memory using the IGZO material as a channel layer may not use a hole injection erase technique at all.

Accordingly, in the 3D flash memory using the IGZO material as a channel layer, a technology capable of supporting the hole injection erase technique is required.

DETAILED DESCRIPTION OF THE INVENTION

Technical Problem

Embodiments of the inventive concept provide a 3D flash memory that fills the inner space of a hollow macaroni-shaped channel layer with a P-type filer to support a hole injection erase technique in a structure using IGZO material as the channel layer, and a manufacturing method thereof.

Embodiments of the inventive concept provide a 3D flash memory, to which at least one of a structure in which a doping concentration of a P-type filer is adjusted or a structure in which a nitride layer is interposed between the P-type filer and a channel layer is applied, to suppress or block a leakage current capable of occurring in the P-type filer, and a method for manufacturing the same.

Technical Solution

According to an embodiment, the three-dimensional flash memory includes a substrate, a channel layer extending in one direction on the substrate and having the shape of a hollow macaroni, and a P-type filer extending in the one direction while filling the inner space of the channel layer.

According to an aspect, the P-type filer may support a hole injection erase technique by supplying a voltage applied from the substrate to an entire area of the channel layer.

According to another aspect, the P-type filer may have a doping concentration for suppressing a leakage current.

According to still another aspect, an interface between the P-type filer and the channel layer may have a trap density for suppressing the leakage current.

According to yet another aspect, the 3D flash memory may further include a nitride layer interposed between the channel layer and the P-type filer and for blocking a leakage current of the P-type filer.

According to yet another aspect, a thickness of the nitride layer may be determined as a value that allows a hole to move between the P-type filer and the channel layer by trap assist tunneling (TAT) of the nitride layer.

According to yet another aspect, the channel layer may be formed by using a material including at least one of In, Zn, or Ga or a group IV semiconductor material.

According to yet another aspect, the 3D flash memory may further include an oxide-nitride-oxide (ONO) layer surrounding the channel layer and extending in the one direction.

According to an embodiment, a method of manufacturing a 3D flash memory includes forming a channel layer having a shape of a hollow macaroni on a substrate so as to be extended in one direction, and forming a P-type filer in an inner space of the channel layer so as to be extended in the one direction.

According to an aspect, the forming of the P-type filer may include forming the P-type filer, which supports a hole injection erase technique by supplying a voltage applied from the substrate to an entire area of the channel layer, so as to be extended in the one direction.

According to another aspect, the forming of the P-type filer may include forming the P-type filer, which has a doping concentration for suppressing a leakage current, so as to be extended in the one direction.

According to still another aspect, the forming of the P-type filer may include forming the P-type filer so as to be extended in the one direction such that an interface between the P-type filer and the channel layer has a trap density for suppressing the leakage current.

According to yet another aspect, the forming of the channel layer may include forming the channel layer by using a material including at least one of In, Zn, or Ga or a group IV semiconductor material.

According to yet another aspect, a method of manufacturing a 3D flash memory may further include forming an ONO layer in the one direction to surround the channel layer.

According to an embodiment, a method of manufacturing a 3D flash memory may further include forming a channel layer having a shape of a hollow macaroni on a substrate so as to be extended in one direction, forming a nitride layer having a shape of a hollow macaroni in an inner space of the channel layer so as to be extended in the one direction, and forming a P-type filer in an inner space of the nitride layer so as to be extended in the one direction.

According to an aspect, the forming of the P-type filer may include forming the P-type filer, which supports a hole injection erase technique by supplying a voltage applied from the substrate to an entire area of the channel layer, so as to be extended in the one direction.

According to another aspect, the forming of the nitride layer includes forming the nitride layer for blocking a leakage current of the P-type filer so as to be extended in the one direction.

According to still another aspect, the forming of the nitride layer includes forming the nitride to have a thickness, which allows a hole to move between the P-type filer and the channel layer by TAT of the nitride layer, while extending the nitride layer in one direction.

Advantageous Effects of the Invention

In an embodiment, it is possible to propose a 3D flash memory supporting a hole injection erase technique in a structure using an IGZO material as a channel layer, by filling the inner space of a hollow macaroni-shaped channel layer with a P-type filer, and a manufacturing method thereof.

Accordingly, in an embodiment, it is possible to support the hole injection erase technique at the same time while leakage current caused by the length extension of the channel layer is prevented.

In particular, in an embodiment, it is possible to propose the 3D flash memory that suppresses or blocks a leakage current capable of occurring in the P-type filer, by applying at least one of a structure in which a doping concentration of the P-type filer is adjusted, or a structure in which a nitride layer is interposed between the P-type filer and a channel layer, and a manufacturing method thereof.

BEST MODE

Figure 1:
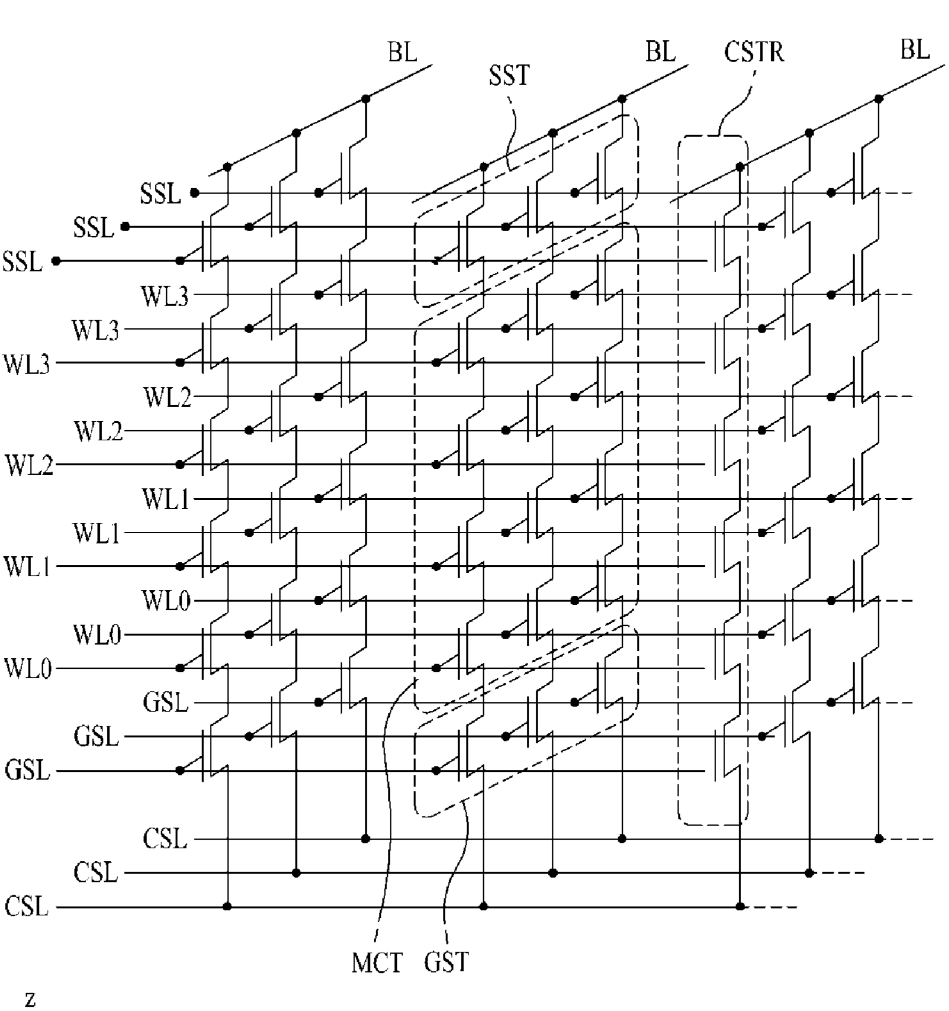
FIG. 1 is a circuit diagram illustrating an array of a conventional 3D flash memory.
Figure 1:
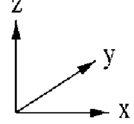
Figure 2:
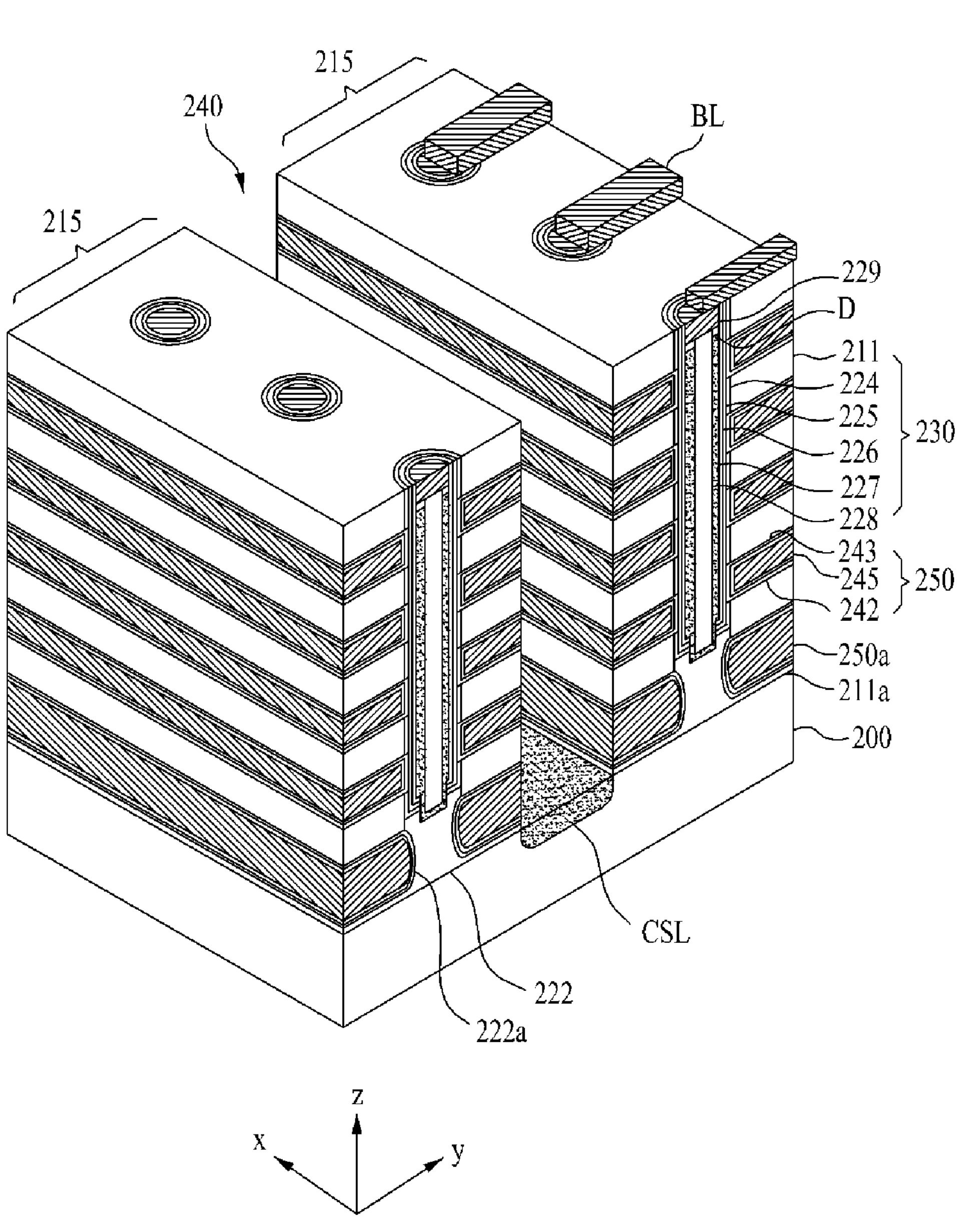
FIG. 2 is a perspective view illustrating a structure of a conventional 3D flash memory.

Hereinafter, embodiments will be described in detail with reference to the accompanying drawings. However, the inventive concept are not limited or restricted by the embodiments. Further, the same reference signs/numerals in the drawings denote the same members.

Furthermore, the terminologies used herein are used to properly express the embodiments of the inventive concept, and may be changed according to the intentions of the user or the manager or the custom in the field to which the inventive concept pertains. Accordingly, definition of the terms should be made according to the overall disclosure set forth herein.

Figure 3:
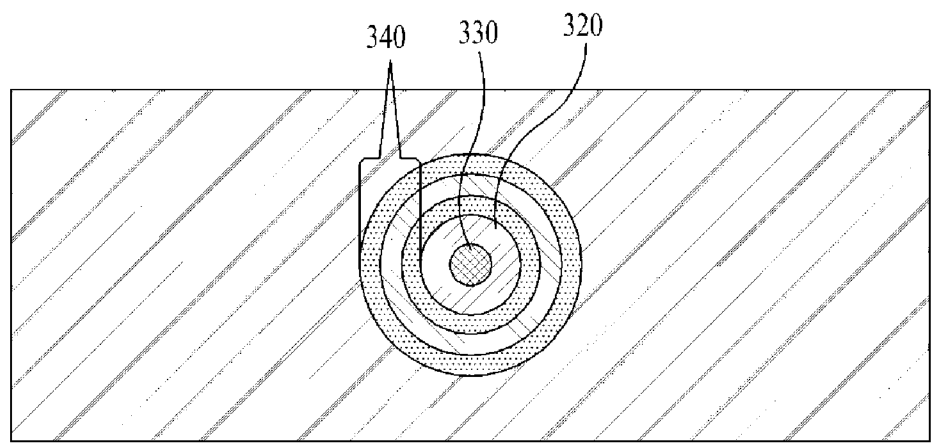
FIG. 3 is a top view illustrating a 3D flash memory, according to an embodiment.
Figure 4:
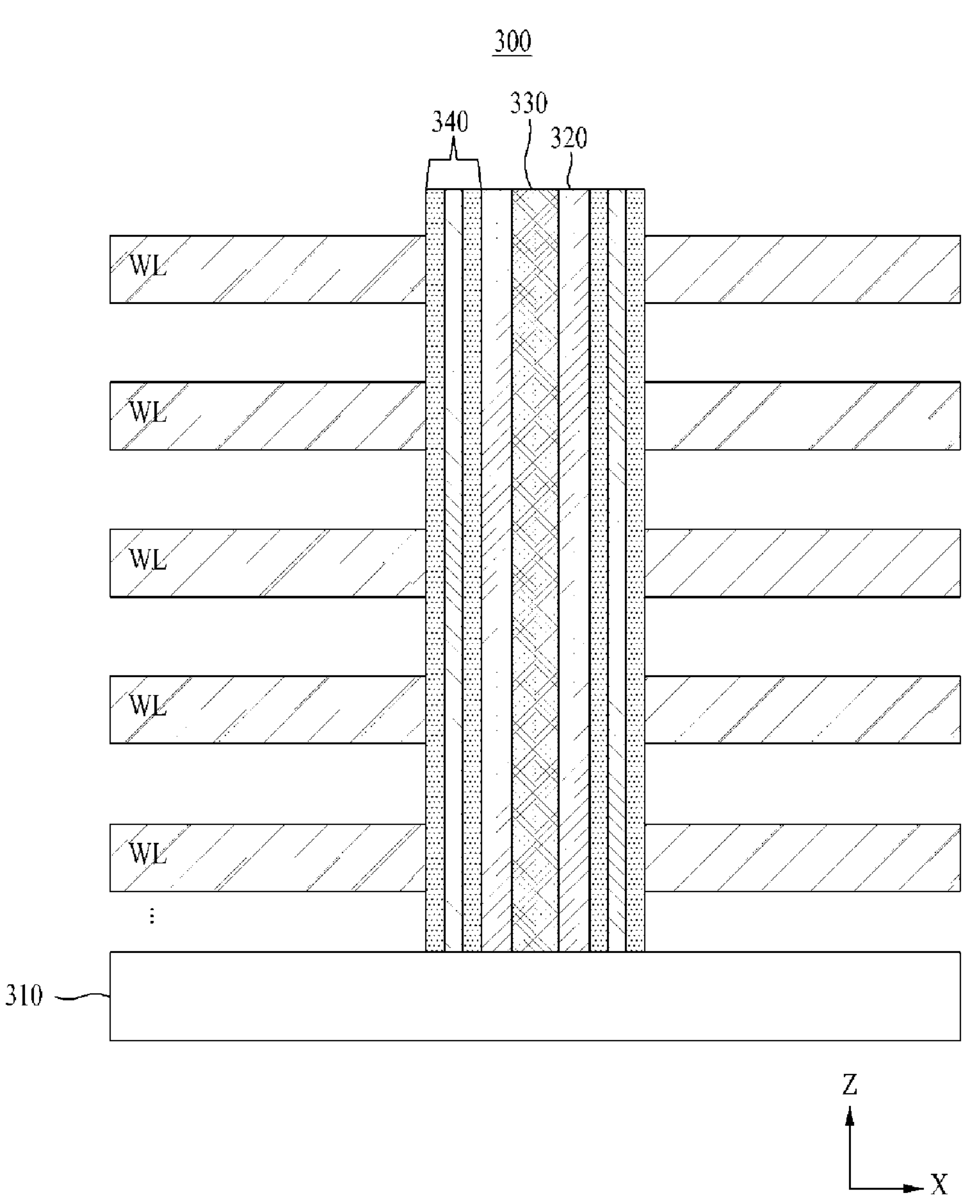
FIG. 4 is a cross-sectional view illustrating the 3D flash memory shown in FIG. 3.
Figure 5:
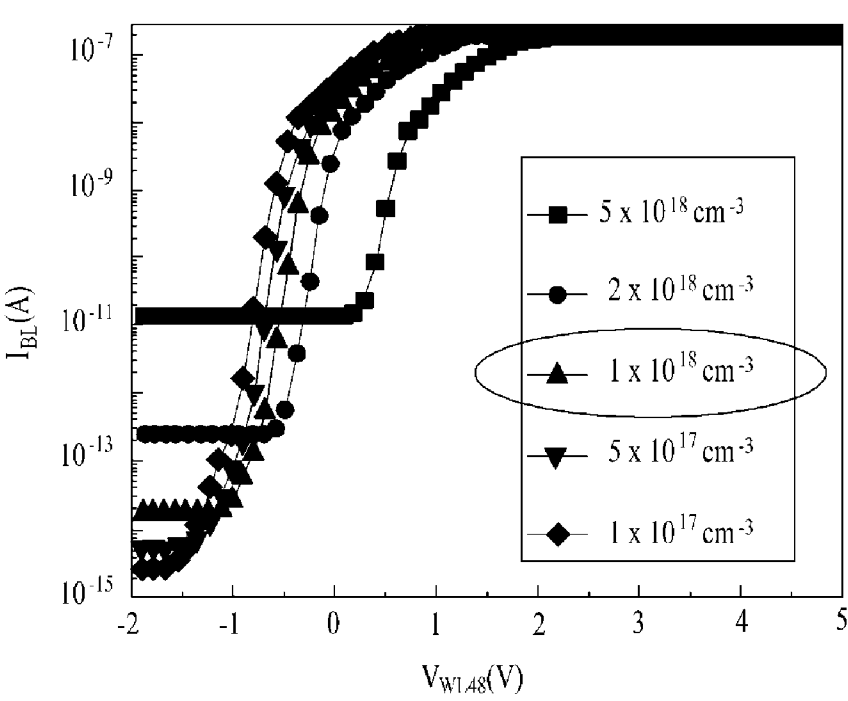
FIG. 5 is a graph for describing leakage current characteristics according to a doping concentration of a P-type filer in a 3D flash memory, according to an embodiment.
Figure 6:
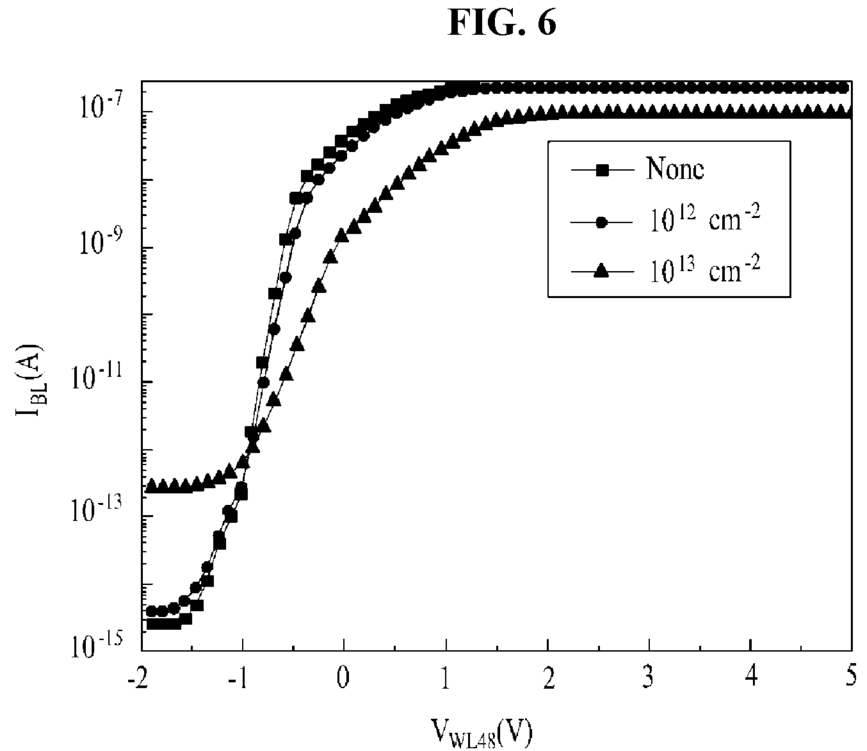
FIG. 6 is a graph for describing leakage current characteristics according to trap density of an interface between a P-type filer and a channel layer in a 3D flash memory, according to an embodiment.

FIG. 3 is a top view illustrating a 3D flash memory, according to an embodiment. FIG. 4 is a cross-sectional view illustrating the 3D flash memory shown in FIG. 3. FIG. 5 is a graph for describing leakage current characteristics according to a doping concentration of a P-type filer in a 3D flash memory, according to an embodiment. FIG. 6 is a graph for describing leakage current characteristics according to trap density of an interface between a P-type filer and a channel layer in a 3D flash memory, according to an embodiment.

Referring to FIGS. 3 to 6, a 3D flash memory 300 according to an embodiment includes a substrate 310, a channel layer 320, and a P-type filer 330.

The channel layer 320 is formed on the substrate 310 in a shape of a hollow macaroni so as to be extended in one direction. Hereinafter, the one direction refers to a vertical direction perpendicular to a plane of the substrate 310.

The P-type filer 330 is filled in the inner space of the channel layer so as to be extended in one direction. As such, the P-type filer 330 may be formed of a P-type semiconductor material to supply a voltage applied from the substrate 310 to the entire area of the channel layer 320 such that the hole is injected into the channel layer 320 due to a potential difference between a high voltage of the channel layer 320 and ground voltages of word lines contacting the channel layer 320, thereby supporting a hole injection erase technique.

Because the 3D flash memory 300 according to an embodiment uses the hole injection erase technique through the above-described P-type filer 330, the channel layer 320 may be formed of a material (e.g., $ZnO_x$-based materials including AZO, ZTO, IZO, ITO, IGZO, or Ag—ZnO) including at least one of In, Zn, or Ga, which has a wide band gap to prevent leakage current. Besides, the material forming the channel layer 320 is not limited thereto, and the channel layer 320 may be formed of a Group IV semiconductor material satisfying a condition for preventing leakage current by having a wide band gap.

Because the P-type filer 330 directly contacts the channel layer 320 in the 3D flash memory 300 having this structure, a leakage current of the P-type filer 330 may occur. The leakage current of the P-type filer 330 may be affected by the doping concentration of the P-type filer 330 that is an important factor in band-to-band tunneling. To suppress the leakage current of the P-type filer 330, the 3D flash memory 300 may appropriately adjust the doping concentration of the P-type filer 330.

Accordingly, in the 3D flash memory 300 according to an embodiment, the P-type filer 330 may be formed to have a doping concentration for suppressing the leakage current. In this regard, referring to FIG. 5, it is identified that the leakage current is not greater than $10^{-14}$ A from a point at which the doping concentration of the P-type filer 330 is "$1\times10^{18}$ $cm^{-3}$". Accordingly, to suppress the leakage current, the P-type filer 330 may be formed to have the doping concentration of, for example, "$5\times10^{17}$ $cm^{-3}$" or less.

Furthermore, the leakage current of the P-type filer 330 may also be suppressed by the trap density of an interface between the P-type filer 330 and the channel layer 320. To suppress the leakage current of the P-type filer 330, the 3D flash memory 300 may appropriately adjust the trap density of the interface between the P-type filer 330 and the channel layer 320. In this regard, referring to FIG. 6, when the trap density of the interface between the P-type filer 330 and the channel layer 320 is $10^{13}$ $cm^{-2}$, it is identified that the leakage current increases from $10^{-15}$ A to $10^{-13}$ A. Accordingly, to suppress the leakage current, the interface between the P-type filer 330 and the channel layer 320 may be formed to have, for example, a trap density of $10^{13}$ $cm^{-2}$ or less.

An ONO layer 340 that surrounds the channel layer 320 and is extended in one direction may be positioned outside the channel layer 320. Because the ONO layer 340 has the same structure as the ONO layer included in the conventional 3D flash memory and is formed of the same material as the ONO layer included in the conventional 3D flash memory, a detailed description thereof will be omitted to avoid redundancy.

Moreover, a bit line connected to an upper portion of the channel layer 320 and a plurality of word lines connected to the ONO layer 340 may be included in the 3D flash memory 300. However, because the bit line and the word lines have the same structure as the bit line and word lines included in the conventional 3D flash memory and are formed of the same material as the bit line and word lines included in the conventional 3D flash memory, a detailed description thereof will be omitted to avoid redundancy.

As such, the 3D flash memory 300 according to an embodiment has a structure, in which a doping concentration is adjusted to suppress a leakage current and which includes the P-type filer 330 and the channel layer 320, thereby supporting a hole injection erase technique while a leakage current capable of occurring in the P-type filer 330 is suppressed or blocked.

Figure 7:
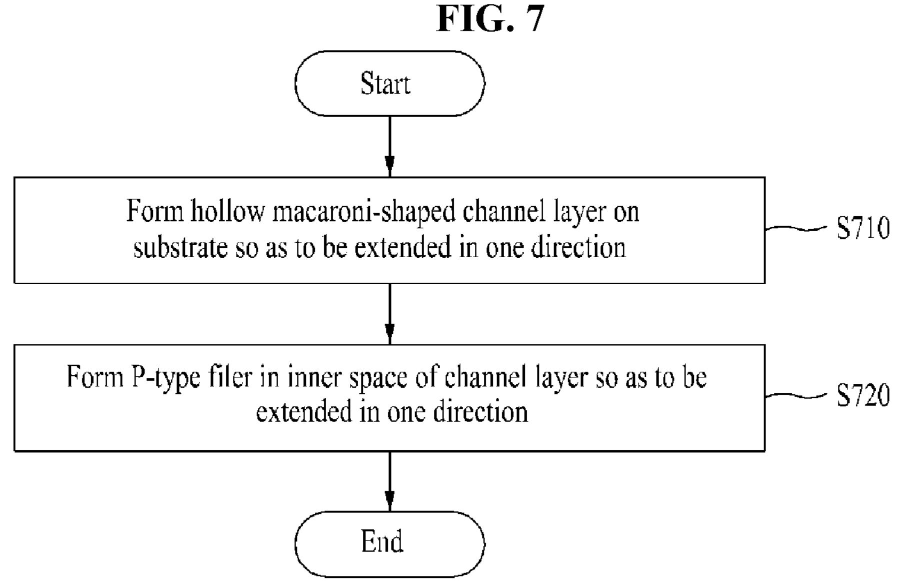
FIG. 7 is a flowchart illustrating a method of manufacturing a 3D flash memory, according to an embodiment.
Figure 8A:
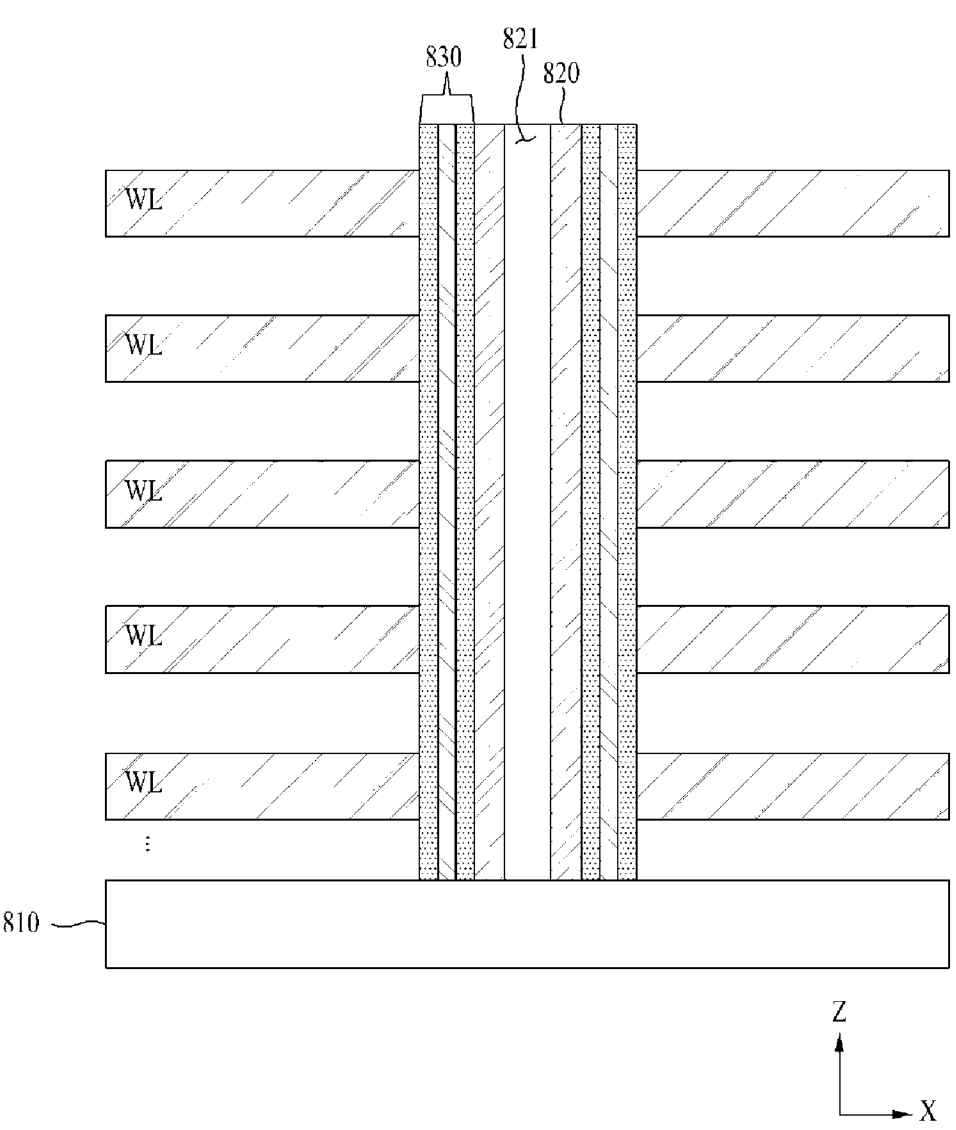
FIGS. 8A and 8B are diagrams for describing a method of manufacturing a 3D flash memory, according to an embodiment.
Figure 8B:
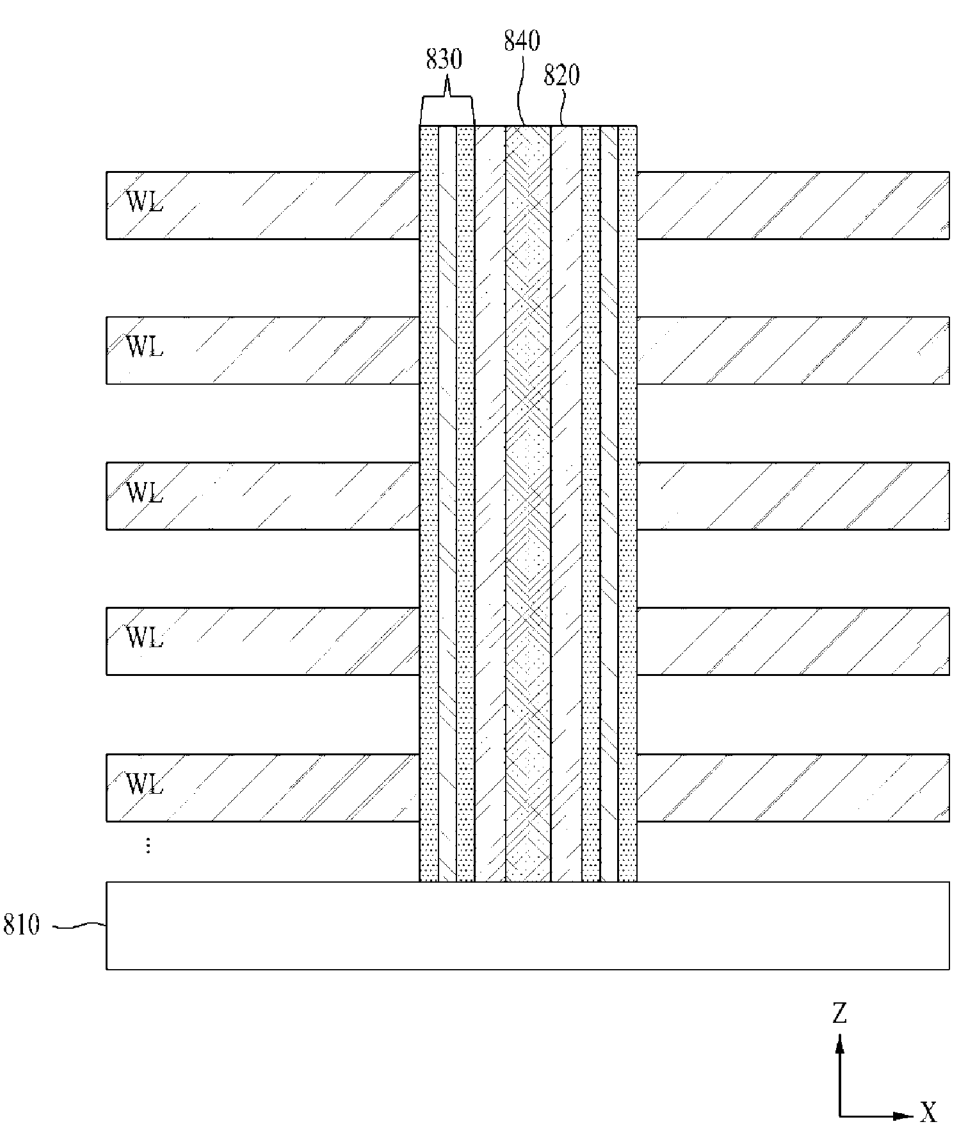

FIG. 7 is a flowchart illustrating a method of manufacturing a 3D flash memory, according to an embodiment. FIGS. 8A and 8B are diagrams for describing a method of manufacturing a 3D flash memory, according to an embodiment. Hereinafter, it is assumed that a method of manufacturing a 3D flash memory is performed by an automated and mechanized manufacturing system. The method of manufacturing a 3D flash memory refers to a method of manufacturing the 3D flash memory 300 described above with reference to FIGS. 3 to 4.

First of all, in operation S710, the manufacturing system forms a hollow macaroni-shaped channel layer 820 on the substrate 810 so as to be extended in one direction, as illustrated in FIG. 8A. For example, in operation S710, the manufacturing system may form the channel layer 820 by using a material including at least one of In, Zn, or Ga or a group IV semiconductor material having a wide band gap to prevent a leakage current.

At this time, in operation S710, the manufacturing system may form an ONO layer 830 in one direction to surround the channel layer 820. Here, it is described that the ONO layer 830 is formed to be extended after the channel layer 820 is formed, but not limited thereto. The manufacturing method may also be performed in order in which the ONO layer 830 is first formed in a form of a hollow macaroni before the channel layer 820 is formed and then the channel layer 820 is formed in the inner space of the ONO layer 830.

Hereinafter, for convenience of description, a plurality of word lines vertically coupled to the ONO layer 830 and a bit line coupled to an upper portion of the channel layer 820 are not shown in the drawing.

Afterward, in operation S720, the manufacturing system forms a P-type filer 840 in the inner space 821 of the channel layer 820 so as to be extended in one direction, as illustrated in FIG. 8B.

Here, the P-type filer 840 is formed by using a P-type semiconductor material to be connected to the substrate 810, thereby supporting a hole injection erase technique by supplying a voltage applied from the substrate 810 to the entire area of the channel layer 820.

In particular, in operation S720, the manufacturing system may form the P-type filer 840 having a doping concentration that suppresses a leakage current so as to be extended in one direction. For example, to suppress the leakage current, the manufacturing system may form the P-type filer 840 having a doping concentration of "$5\times10^{17}$ $cm^{-3}$" or less.

Moreover, in operation S720, the manufacturing system may form the P-type filer 840 so as to be extended in one direction such that an interface between the P-type filer 840 and the channel layer 820 has a trap density for suppressing the leakage current.

Figure 9:
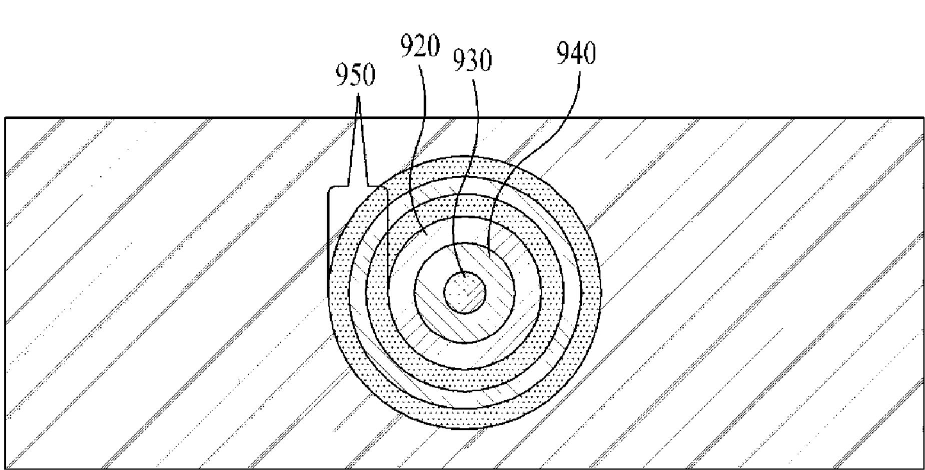
FIG. 9 is a top view illustrating a 3D flash memory, according to an embodiment.
Figure 10:
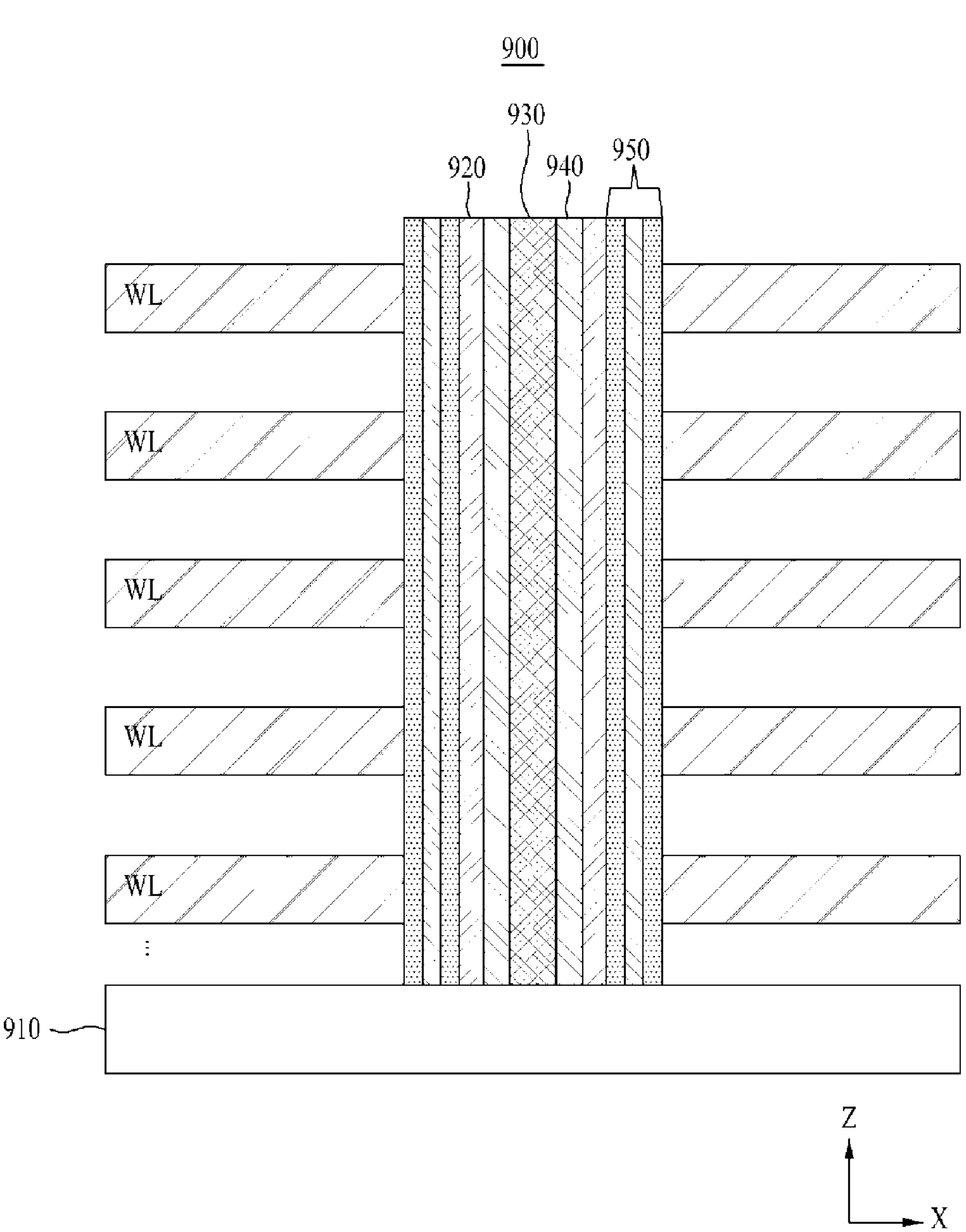
FIG. 10 is a cross-sectional view illustrating the 3D flash memory shown in FIG. 9.

FIG. 9 is a top view illustrating a 3D flash memory, according to another embodiment. FIG. 10 is a cross-sectional view illustrating the 3D flash memory shown in FIG. 9.

Referring to FIGS. 9 and 10, a 3D flash memory 900 according to another embodiment includes a substrate 910, a channel layer 920, a P-type filer 930, and a nitride layer 940.

The channel layer 920 is formed on the substrate 910 in a shape of a hollow macaroni so as to be extended in one direction The P-type filer 930 is filled in the inner space of the channel layer 920 so as to be extended in one direction. As such, the P-type filer 930 may be formed of a P-type semiconductor material to supply a voltage applied from the substrate 910 to the entire area of the channel layer 920 such that the hole is injected into the channel layer 920 due to a potential difference between a high voltage of the channel layer 920 and ground voltages of word lines contacting the channel layer 920, thereby supporting a hole injection erase technique.

Because the 3D flash memory 900 according to another embodiment uses the hole injection erase technique through the above-described P-type filer 930, the channel layer 920 may be formed of a material (e.g., $ZnO_x$-based materials including AZO, ZTO, IZO, ITO, IGZO, or Ag—ZnO) including at least one of In, Zn, or Ga, which has a wide band gap to prevent leakage current. Besides, the material forming the channel layer 920 is not limited thereto, and the channel layer 320 may be formed of a Group IV semiconductor material satisfying a condition for preventing leakage current by having a wide band gap.

The nitride layer 940 is interposed between the P-type filer 930 and the channel layer 920 to inject a hole into the channel layer 920 by using a trap, which is present internally, such that a voltage applied from the substrate 910 is capable of being supplied to the entire area of the channel layer 920 through the P-type filer 930. Accordingly, the thickness of the nitride layer 940 may be determined as a value that allows a hole to move between the P-type filer 930 and the channel layer 920 by trap assist tunneling (TAT) of the nitride layer 940.

Besides, the nitride layer 940 blocks a leakage current capable of occurring in the P-type filer 930. Accordingly, the thickness of the nitride layer 940 may be determined as a value for blocking the leakage current capable of occurring in the P-type filer 930.

As such, the nitride layer 940 may block the leakage current capable of occurring in the P-type filer 930, and, at the same time, may move a hole between the P-type filer 930 and the channel layer 920. The thickness of the nitride layer 940 may be determined as a value (e.g., 8 nm) that allows the hole to move between the channel layer 920 and the P-type filer 930 of the nitride layer 940, and, at the same time, blocks a leakage current capable of occurring in the P-type filer 930.

An ONO layer 950 that surrounds the channel layer 920 and is extended in one direction may be positioned outside the channel layer 920. Because the ONO layer 950 has the same structure as the ONO layer included in the conventional 3D flash memory and is formed of the same material as the ONO layer included in the conventional 3D flash memory, a detailed description thereof will be omitted to avoid redundancy.

Moreover, a bit line connected to an upper portion of the channel layer 920 and a plurality of word lines connected to the ONO layer 950 may be included in the 3D flash memory 900. However, because the bit line and the word lines have the same structure as the bit line and word lines included in the conventional 3D flash memory and are formed of the same material as the bit line and word lines included in the conventional 3D flash memory, a detailed description thereof will be omitted to avoid redundancy.

As such, the 3D flash memory 900 according to another embodiment has a structure, in which the nitride layer 940 is interposed between the P-type filer 930 and the channel layer 920, thereby supporting a hole injection erase technique while a leakage current capable of occurring in the P-type filer 930 is suppressed or blocked.

Figure 11:
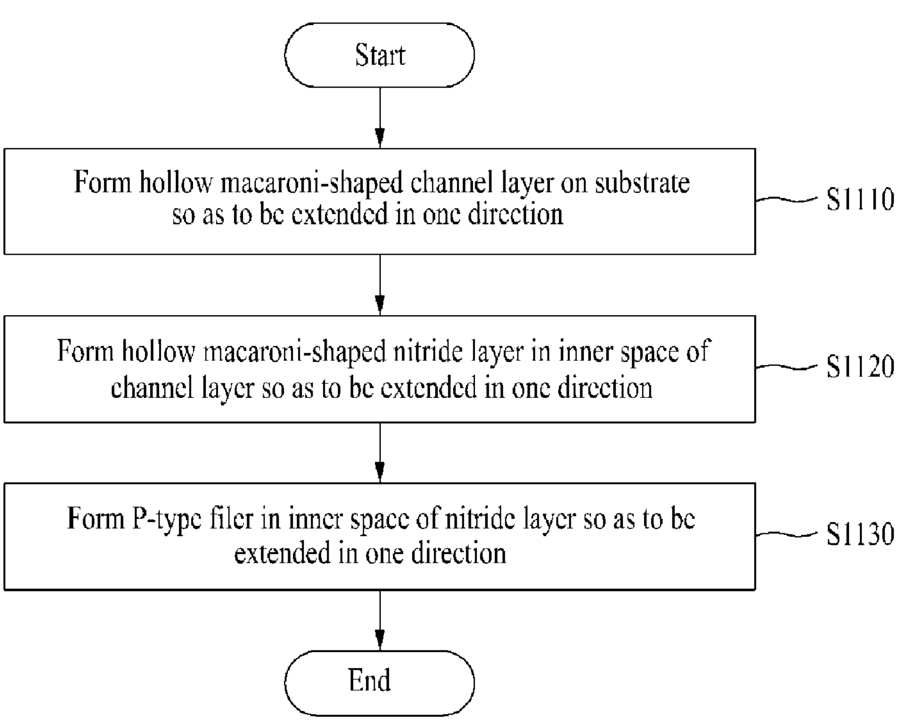
FIG. 11 is a flowchart illustrating a method of manufacturing a 3D flash memory, according to another embodiment.
Figure 12A:
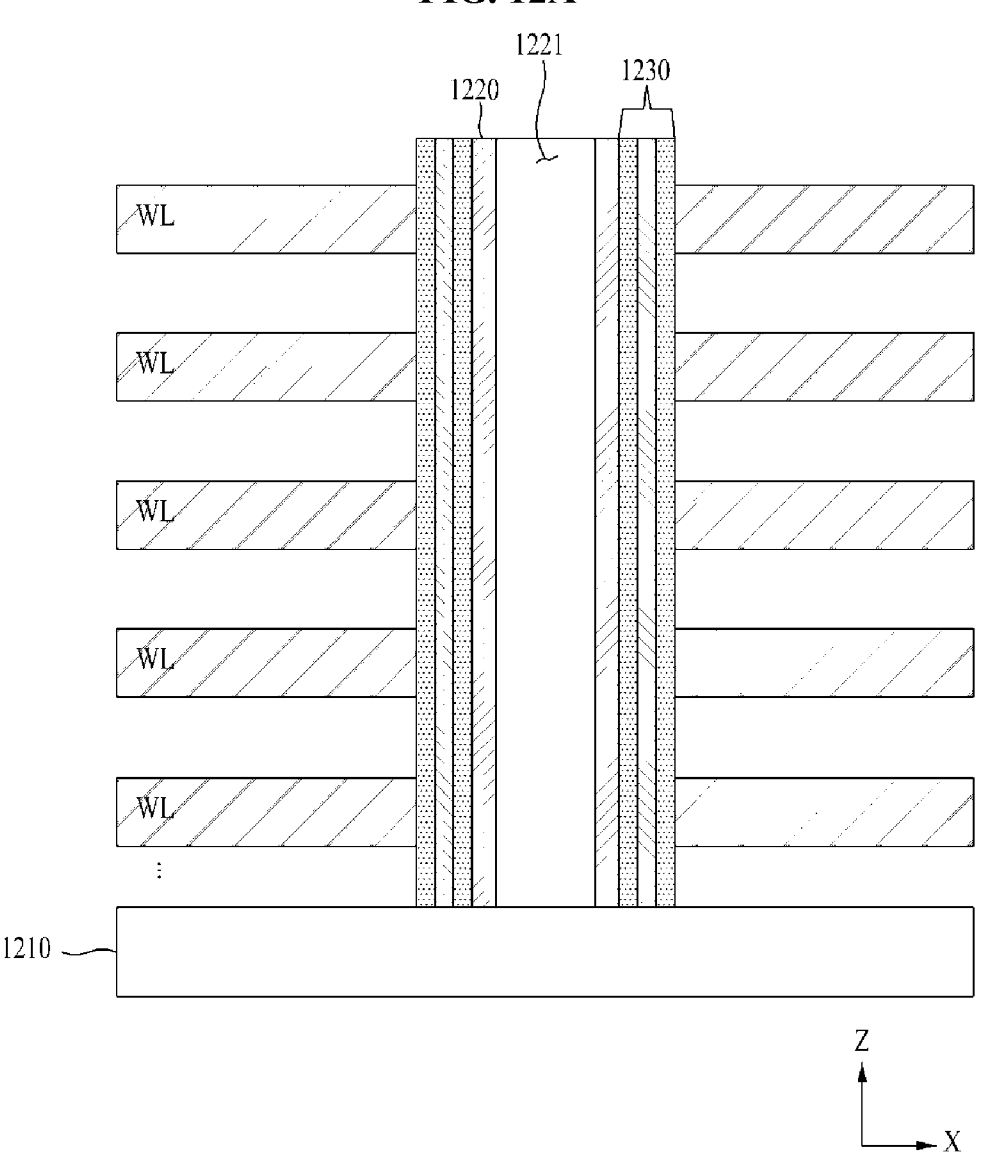
FIGS. 12A to 12C are diagrams for describing a method of manufacturing a 3D flash memory, according to another embodiment.
Figure 12B:
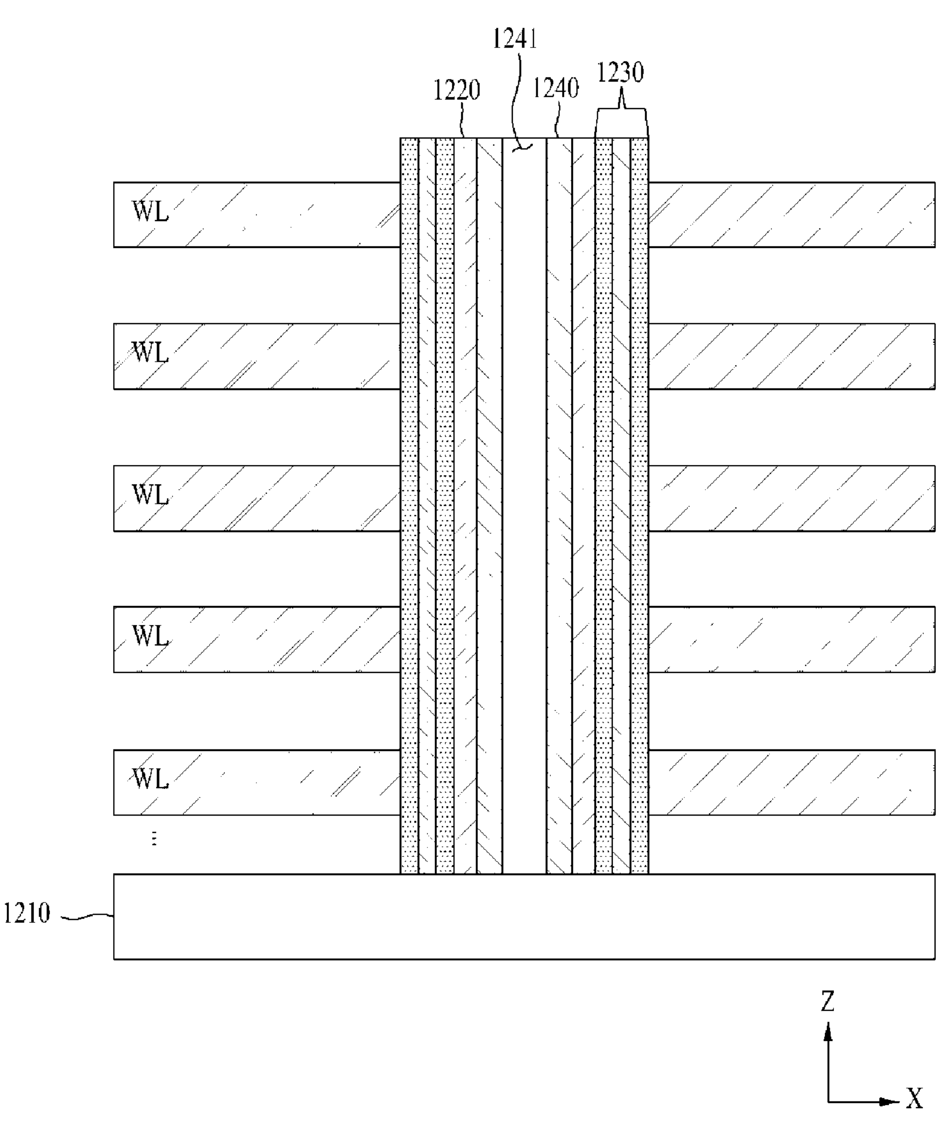
Figure 12C:
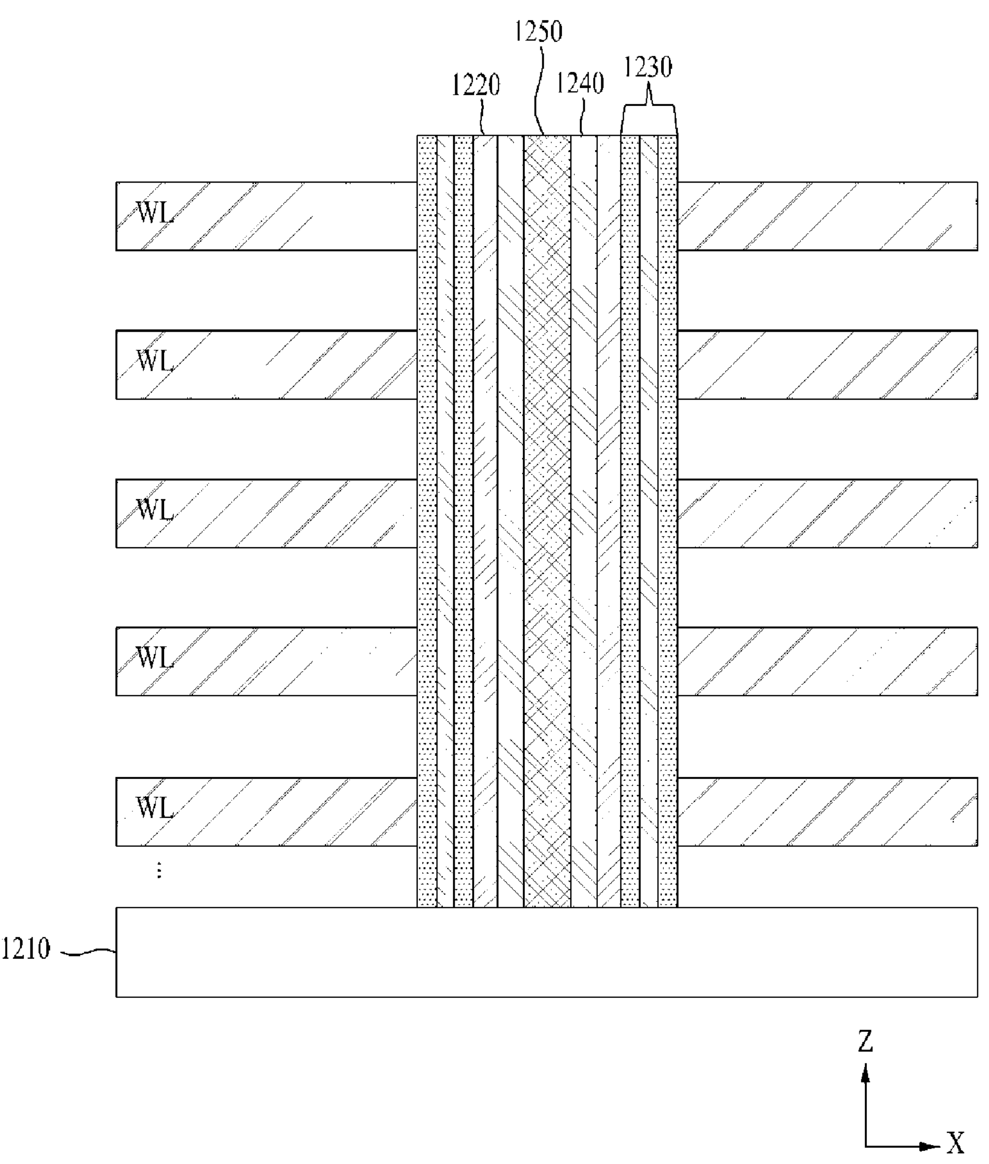

FIG. 11 is a flowchart illustrating a method of manufacturing a 3D flash memory, according to another embodiment. FIGS. 12A to 12C are diagrams for describing a method of manufacturing a 3D flash memory, according to another embodiment. Hereinafter, it is assumed that a method of manufacturing a 3D flash memory is performed by an automated and mechanized manufacturing system. The method of manufacturing a 3D flash memory refers to a method of manufacturing the 3D flash memory 900 described above with reference to FIGS. 9 and 10.

First of all, in operation S1110, the manufacturing system forms a hollow macaroni-shaped channel layer 1220 on the substrate 1210 so as to be extended in one direction, as illustrated in FIG. 12A. For example, in operation S1110, the manufacturing system may form the channel layer 1220 by using a material including at least one of In, Zn, or Ga or a group IV semiconductor material having a wide band gap to prevent a leakage current.

At this time, in operation S1110, the manufacturing system may form an ONO layer 1230 in one direction to surround the channel layer 1220. Here, it is described that the ONO layer 1230 is formed to be extended after the channel layer 1220 is formed, but not limited thereto. The manufacturing method may also be performed in order in which the ONO layer 1230 is first formed in a form of a hollow macaroni before the channel layer 1220 is formed and then the channel layer 1220 is formed in the inner space of the ONO layer 1230.

Hereinafter, for convenience of description, a plurality of word lines vertically coupled to the ONO layer 1230 and a bit line coupled to an upper portion of the channel layer 1220 are not shown in the drawing.

Next, in operation S1120, the manufacturing system forms a hollow macaroni-shaped nitride layer 1240 in the inner space 1221 of the channel layer 1220 so as to be extended in one direction, as illustrated in FIG. 12B. In particular, in operation S1120, the manufacturing system may form the nitride layer 1240 to have a thickness, which blocks a leakage current of the P-type filer 1250 that is to be formed in operation S1130 to be described later, while extending the nitride layer 1240 in one direction.

Moreover, in operation S1120, the manufacturing system may form the nitride 1240 to have a thickness, which allows the hole to move between the P-type filer 1250 and the channel layer 1220 by the TAT of the nitride layer 1240, while extending the nitride layer 1240 in one direction.

As such, because the nitride layer 1240 blocks the leakage current of the P-type filer 1250 and moves a hole between the P-type filer 1250 and the channel layer 1220, the nitride layer 1240 may be formed to have a thickness suitable for blocking and moving.

Afterward, in operation S1130, the manufacturing system forms a P-type filer 1250 in the inner space 1241 of the nitride layer 1240 so as to be extended in one direction, as illustrated in FIG. 12C.

Here, the P-type filer 1250 is formed by using a P-type semiconductor material to be connected to the substrate 1210, thereby supporting a hole injection erase technique by supplying a voltage applied from the substrate 1210 to the entire area of the channel layer 1220.

While a few embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

The invention claimed is:

1. A method of manufacturing a three-dimensional (3D) flash memory, the method comprising:

forming a channel layer having a shape of a hollow macaroni on a substrate so as to be extended in one direction;

forming a nitride layer having a shape of a hollow macaroni in an inner space of the channel layer so as to be extended in the one direction; and forming a P-type filer in an inner space of the nitride layer and in contact with the substrate so as to be extended in the one direction, wherein the forming of the nitride layer includes:

forming the nitride layer for blocking a leakage current of the P-type filer so as to be extended in the one direction, wherein a thickness of the nitride layer is determined as a value that allows a hole to move between the P-type filer and the channel layer by trap assist tunneling (TAT) of the nitride layer.

* * * * *